US010861388B2

(12) United States Patent
Li et al.

(10) Patent No.: US 10,861,388 B2
(45) Date of Patent: Dec. 8, 2020

(54) DISPLAY PANEL AND DRIVING METHOD THEREOF, DISPLAY DEVICE

(71) Applicant: BOE TECHNOLOGY GROUP CO., LTD., Beijing (CN)

(72) Inventors: Zhenzhen Li, Beijing (CN); Libin Liu, Beijing (CN); Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/518,350

(22) Filed: Jul. 22, 2019

(65) Prior Publication Data
US 2020/0286426 A1 Sep. 10, 2020

(30) Foreign Application Priority Data

Mar. 4, 2019 (CN) .......................... 2019 1 0160554

(51) Int. Cl.
G09G 3/3233 (2016.01)
H01L 27/32 (2006.01)
(52) U.S. Cl.
CPC ....... G09G 3/3233 (2013.01); H01L 27/3276 (2013.01); G09G 2320/0233 (2013.01); G09G 2330/021 (2013.01); G09G 2360/16 (2013.01)
(58) Field of Classification Search
None
See application file for complete search history.

(56) References Cited

U.S. PATENT DOCUMENTS

| 8,441,600 | B2 | 5/2013 | Chiou |
| 9,298,300 | B2 | 3/2016 | Roudbari et al. |
| 9,870,757 | B2 | 1/2018 | Genoe |
| 10,629,664 | B2 | 4/2020 | Lin et al. |
| 2007/0242005 | A1 | 10/2007 | Hu |
| 2013/0127932 | A1* | 5/2013 | Han ..................... G09G 3/3233 |
| | | | 345/691 |
| 2015/0022429 | A1 | 1/2015 | Chae et al. |

(Continued)

FOREIGN PATENT DOCUMENTS

| CN | 101290741 A | 10/2008 |
| CN | 101859541 A | 10/2010 |

(Continued)

OTHER PUBLICATIONS

Chinese Office Action in Chinese Application No. 201910160554.0, dated Apr. 3, 2020 with English translation.

(Continued)

Primary Examiner — Nicholas J Lee
(74) Attorney, Agent, or Firm — Collard & Roe, P.C.

(57) ABSTRACT

A display panel and a driving method thereof, a display device. The display panel includes a common cathode, a first power terminal, a first wire and a first switch. The driving method includes: obtaining a total image current of a display image; and determining whether the total image current is greater than a first threshold current, if the total image current is greater than the first threshold current, controlling the first switch to disconnect the first wire, if the total image current is not greater than the first threshold current, controlling the first switch to connect the first wire, so that the second side of the common cathode is connected to the first power terminal through the first wire.

20 Claims, 5 Drawing Sheets

(56) References Cited

U.S. PATENT DOCUMENTS

2016/0260381 A1  9/2016 Gai et al.
2019/0363155 A1 11/2019 Xiao et al.

FOREIGN PATENT DOCUMENTS

| CN | 104299569 A | 1/2015 |
| CN | 104813391 A | 7/2015 |
| CN | 105074550 A | 11/2015 |
| CN | 108292488 A | 7/2018 |
| CN | 108766353 A | 11/2018 |
| CN | 109147676 A | 1/2019 |
| CN | 109390351 A | 2/2019 |

OTHER PUBLICATIONS

Wenjiang Liu, "Research on Low Power AMOLED Pixel Circles and Driving Method", A Dissertation Submitted to Shanghai Jiao Tong University for the Degree of Philosophy Doctor, Oct. 2014 with English translation (28 pages).

Liu Ming, "Analysis and Design of Active OLED Display Control Circuit", China High-tech Enterprise Phase II, China Academic Journal Electronic Publishing House, 2017, pp. 24-26 with English translation (12 pages).

\* cited by examiner

DISPLAY PANEL AND DRIVING METHOD THEREOF, DISPLAY DEVICE

CROSS-REFERENCE TO RELATED APPLICATION

The present application claims priority of the Chinese Patent Application No. 201910160554.0, filed on Mar. 4, 2019 and entitled "Display Panel and Driving Method thereof, Display Device", the disclosure of which is incorporated herein by reference in its entirety as part of the present application.

TECHNICAL FIELD

Embodiments of the present disclosure relate to a display panel and a driving method thereof, a display device.

BACKGROUND

Organic light-emitting diode (OLED) display panels have advantages of thin thickness, light weight, wide viewing angle, active illumination, continuously adjustable illumination color, low cost, fast response, low energy consumption, low driving voltage, wide operating temperature range, simple production process, high luminous efficiency and flexible display, etc., and have been widely used in display fields such as mobile phones, tablet computers and digital cameras, etc.

SUMMARY

At least one embodiment of the present disclosure provides a driving method of a display panel, the display panel includes: a plurality of sub-pixels arranged in an array, the plurality of sub-pixels including a common cathode; a first power terminal, electrically connected to a first side of the common cathode, and configured to provide a first power voltage to the plurality of sub-pixels through the common cathode; a first wire and a first switch, a second end of the first wire being electrically connected to a second side of the common cathode, a first end of the first wire being electrically connected to the first power terminal, the first switch being set over the first wire and being configured to control whether the first wire is connected or disconnected, and the second side of the common cathode being opposite to the first side of the common cathode and away from the first power terminal; and the driving method includes: obtaining a total image current of a display image of the plurality of sub-pixels arranged in the array; and determining whether the total image current is greater than a first threshold current, if the total image current is greater than the first threshold current, controlling the first switch to disconnect the first wire, and if the total image current is not greater than the first threshold current, controlling the first switch to connect the first wire, so that the second side of the common cathode is connected to the first power terminal through the first wire.

For example, in the driving method provided by some embodiments of the present disclosure, the display panel further includes: a second wire and a second switch, a second end of the second wire being electrically connected to the second side of the common cathode, a first end of the second wire being electrically connected to the first power terminal, the second switch being set over the second wire and being configured to control whether the second wire is connected or disconnected; and the driving method further includes: determining whether the total image current is greater than a second threshold current, if the total image current is greater than the second threshold current, controlling the second switch to disconnect the first wire, and if the total image current is not greater than the second threshold current, controlling the second switch to connect the first wire, so that the second side of the common cathode is connected to the first power terminal through the second wire; the second threshold current is less than the first threshold current.

For example, in the driving method provided by some embodiments of the present disclosure, obtaining the total image current of the display image of the plurality of sub-pixels arranged in the array includes: predicting the total image current according to grayscale signals of the display image; or measuring a total image current of a previous frame of display image, and using the total image current of the previous frame of display image as the total image current of the display image.

For example, in the driving method provided by some embodiments of the present disclosure, predicting the total image current according to the grayscale signals of the display image includes: obtaining data signals of respective sub-pixels of the display image according to the grayscale signals of the display image; calculating current signals required to drive the respective sub-pixels to display according to the data signals of the respective sub-pixels; and calculating the total image current according to the current signals of the respective sub-pixels.

For example, in the driving method provided by some embodiments of the present disclosure, the display panel further includes: a second power terminal and a second power line, the second power line being electrically connected to the plurality of sub-pixels, the second power terminal being electrically connected to the second power line, the second power terminal being configured to provide a second power voltage to the plurality of sub-pixels through the second power line; and the driving method further includes: adjusting values of the data signals provided to the respective sub-pixels according to IR drops of the second power line between the respective sub-pixels and the second power terminal.

For example, in the driving method provided by some embodiments of the present disclosure, adjustment values of the data signals of the respective sub-pixels are the same as values of the IR drops.

At least one embodiment of the present disclosure also provides a display panel, which includes: a plurality of sub-pixels arranged in an array, the plurality of sub-pixels including a common cathode; a first power terminal, electrically connected to a first side of the common cathode, and configured to provide a first power voltage to the plurality of sub-pixels through the common cathode; a first wire and a first switch, a second end of the first wire being electrically connected to a second side of the common cathode, a first end of the first wire being electrically connected to the first power terminal, the first switch being set over the first wire and being configured to control whether the first wire is connected or disconnected, and the second side of the common cathode being opposite to the first side of the common cathode and away from the first power terminal.

For example, the display panel provided by some embodiments of the present disclosure further includes: a controller, configured to obtain a total image current of a display image of the plurality of sub-pixels arranged in the array, to determine whether the total image current is greater than a first threshold current, if the total image current is greater than the first threshold current, to control the first switch to disconnect the first wire, if the total image current is not greater than the first threshold current, to control the first switch to connect the first wire.

For example, the display panel provided by some embodiments of the present disclosure further includes: a second wire and a second switch, a second end of the second wire being electrically connected to the second side of the common cathode, a first end of the second wire being electrically connected to the first power terminal, the second switch being set over the second wire and being configured to control whether the second wire is connected or disconnected.

For example, in the display panel provided by some embodiments of the present disclosure, the controller is further configured to determine whether the total image current is greater than a second threshold current, if the total image current is greater than the second threshold current, to control the second switch to disconnect the second wire, if the total image current is not greater than the second threshold current, to control the second switch to connect the second wire; the second threshold current is less than the first threshold current.

For example, in the display panel provided by some embodiments of the present disclosure, in order to obtain the total image current of the display image of the plurality of sub-pixels arranged in the array, the controller is further configured to predict the total image current according to grayscale signals of the display image, or, configured to measure a total image current of a previous frame of display image and to use the total image current of the previous frame of display image as the total image current of the display image.

For example, in the display panel provided by some embodiments of the present disclosure, in order to predict the total image current according to the grayscale signals of the display image, the controller is further configured to obtain data signals of respective sub-pixels of the display image according to the grayscale signals of the display image, to calculate current signals required to drive the respective sub-pixels to display according to the data signals of the respective sub-pixels, and to calculate the total image current according to the current signals of the respective sub-pixels.

For example, the display panel provided by some embodiments of the present disclosure further includes: a second power terminal and a second power line, the second power line being electrically connected to the plurality of sub-pixels, the second power terminal being electrically connected to the second power line, the second power terminal being configured to provide a second power voltage to the plurality of sub-pixels through the second power line.

For example, in the display panel provided by some embodiments of the present disclosure, the controller is further configured to adjust values of the data signals provided to the respective sub-pixels according to IR drops of the second power line between the respective sub-pixels and the second power terminal.

For example, in the display panel provided by some embodiments of the present disclosure, the controller is further configured to make adjustment values of the data signals of the respective sub-pixels the same as values of the IR drops.

For example, the display panel provided by some embodiments of the present disclosure further includes a power management circuit; the power management circuit includes the first power terminal and the second power terminal, and the first power voltage is different from the second power voltage.

For example, in the display panel provided by some embodiments of the present disclosure, the first wire includes a first sub-wire and a second sub-wire, the first switch includes a first sub-switch and a second sub-switch; the first sub-wire and the second sub-wire are disposed on opposite sides of the display panel, respectively, the first sub-switch is set over the first sub-wire and is configured to control whether the first sub-wire is connected or disconnected, the second sub-switch is set over the second sub-wire and is configured to control whether the second sub-wire is connected or disconnected.

For example, in the display panel provided by some embodiments of the present disclosure, the second wire includes a third sub-wire and a fourth sub-wire, the second switch includes a third sub-switch and a fourth sub-switch; the third sub-wire and the fourth sub-wire are disposed on opposite sides of the display panel, respectively, the third sub-switch is set over the third sub-wire and is configured to control whether the third sub-wire is connected or disconnected, the fourth sub-switch is set over the fourth sub-wire and is configured to control whether the fourth sub-wire is connected or disconnected.

For example, the display panel provided by some embodiments of the present disclosure further includes an auxiliary cathode, the auxiliary cathode is electrically connected to the first power terminal and at least electrically connected to the second side of the common cathode.

At least one embodiment of the present disclosure also provides a display device, which includes a display panel provided by any one embodiment of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
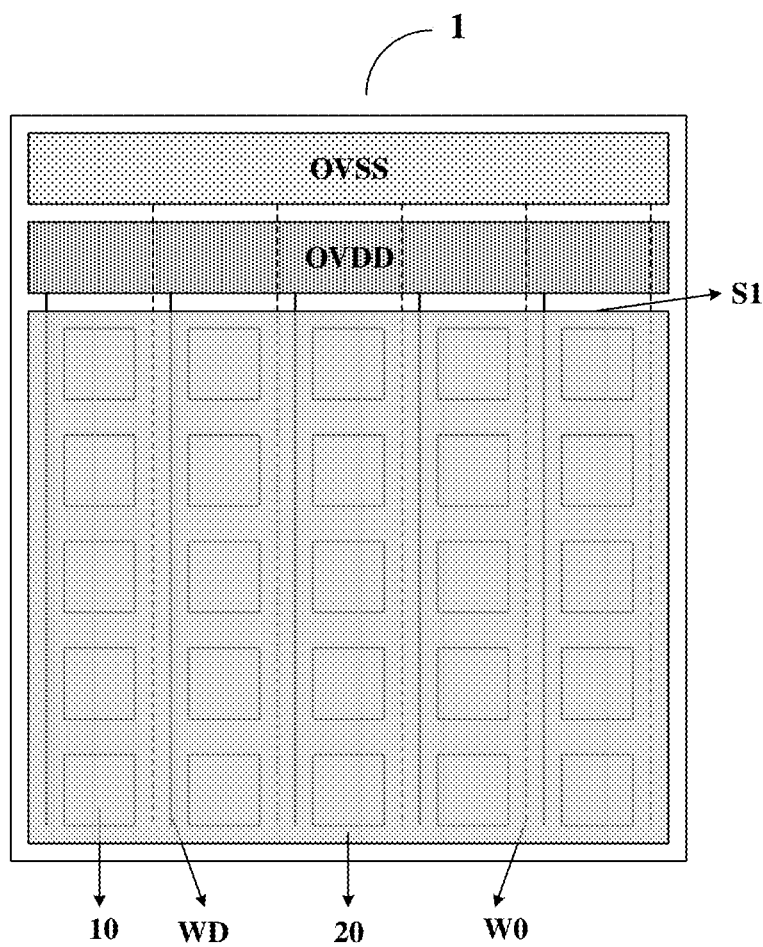
FIG. 1A is a schematic structural diagram of an organic light-emitting diode display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below by means of some specific embodiments. In order to keep the following description of the embodiments of the present disclosure clear and concise, detailed descriptions of known functions and known components may be omitted. When any one component of an embodiment of the present disclosure appears in more than one of the accompanying drawings, the component is denoted by a same or similar reference numeral in each of the drawings.

Figure 1B:
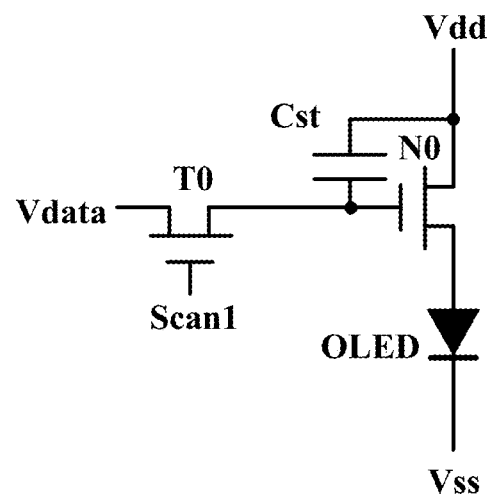
FIG. 1B is a schematic diagram of a pixel circuit.

FIG. 1A is a schematic structural diagram of an organic light-emitting diode (OLED) display panel, and FIG. 1B is a schematic diagram of a pixel circuit. As shown in FIG. 1A, the organic light emitting diode display panel 1 includes a plurality of sub-pixels 10. For example, the plurality of sub-pixels 10 can include a red sub-pixel, a green sub-pixel and a blue sub-pixel, etc., and therefore color display can be achieved. For example, each sub-pixel 10 includes a pixel circuit (or pixel driving circuit) and a light-emitting element (i.e., an OLED). The pixel circuit is configured to generate and control a driving current flowing through the light-emitting element to drive the light-emitting element to emit light, so that the organic light emitting diode display panel 1 performs display.

A basic pixel circuit used in an organic light-emitting diode display panel is usually a 2T1C pixel circuit, that is, a pixel circuit which uses two thin film transistors (TFTs) and one storage capacitor Cst to drive the OLED to emit light.

As shown in FIG. 1B, one 2T1C pixel circuit includes a switching transistor T0, a driving transistor N0, and a storage capacitor Cst. For example, a gate electrode of the switching transistor T0 is connected to a scan line (not shown in FIG. 1B) to receive a scan signal Scan1; for example, a drain electrode of the switching transistor T0 is connected to a data line (not shown in FIG. 1B) to receive a data signal Vdata; a source electrode of the switching transistor T0 is connected to a gate electrode of the driving transistor N0; a drain electrode of the driving transistor N0 is connected to a second power terminal to receive a second power voltage VDD, and a source electrode of the driving transistor N0 is connected to an anode of an OLED; one terminal of the storage capacitor Cst is connected to the source electrode of the switching transistor T0 and the gate electrode of the driving transistor N0, and the other terminal of the storage capacitor Cst is connected to the drain electrode of the driving transistor N0 and the second power terminal; and a cathode of the OLED is connected to a first power terminal to receive a first voltage VSS. For example, a voltage value of the second power voltage VDD is greater than a voltage value of the first power voltage VSS.

The 2T1C pixel circuit uses the two TFTs and the storage capacitor Cst to control a grayscale to be displayed by a sub-pixel including the 2T1C pixel circuit. When the scan signal Scan1 (applied through the scan line) turns on the switching transistor T0, the data signal Vdata (provided by a data driving circuit) written through the data line charges the storage capacitor Cst via the switching transistor T0, therefore the data signal Vdata can be stored in the storage capacitor Cst. The data signal Vdata stored in the storage capacitor Cs can control the conduction degree of the driving transistor N0, therefore the magnitude of the current flowing through the driving transistor (for driving the OLED to emit light) can be controlled; the magnitude of the current determines the grayscale to be displayed by the sub-pixel including the 2T1C pixel circuit. The driving current I generated by the pixel circuit of the sub-pixel 10 and flowing through the light-emitting element is proportional to $(Vdata-VDD-Vth)^2$, where Vth is a threshold voltage of the driving transistor N0. In the 2T1C pixel circuit as shown in FIG. 1B, the switching transistor T0 and the driving transistor N0 are both N-type transistors.

On the basis of the above pixel circuit, a pixel circuit can further include a compensation transistor, a reset transistor, a sensing transistor, etc., to have a compensation function, a reset function, a sensing function, etc., correspondingly. The specific structure and type of the pixel circuit are not limited in the embodiments of the present disclosure. For example, when the pixel circuit includes a compensation transistor, the threshold voltage Vth of the driving transistor N0 can be compensated, so that the driving current I generated by the pixel circuit of the sub-pixel 10 and flowing through the light-emitting element is proportional to $(Vdata-VDD)^2$.

As shown in FIG. 1A, the cathodes of the light-emitting elements in the plurality of sub-pixels 10 arranged in the array usually form a common cathode 20 as a whole, for example, the cathodes of these sub-pixels 10 are integrally formed of a same conductive layer, thereby saving process and saving manufacturing cost.

As shown in FIG. 1A, the organic light-emitting diode display panel 1 further includes a first power terminal OVSS and a second power terminal OVDD. The second power terminal OVDD is electrically connected to the plurality of sub-pixels 10 (i.e., electrically connected to the pixel circuits in the plurality of sub-pixels 10) through a second power line WD (shown as a solid line in FIG. 1A), so as to provide a second power voltage VDD (e.g., a high voltage) to the plurality of sub-pixels 10 through the second power line WD. The first power terminal OVSS is electrically connected to a first side S1 of the common cathode 20 through a first power line (shown as a portion of the dashed line W0, which portion does not overlap with the common cathode 20 in FIG. 1A), so as to provide a first power voltage VDD (e.g., a low voltage, such as a grounded voltage) to the plurality of sub-pixels 10 through the first power line and the common cathode 20.

In the organic light emitting diode display panel 1, the conductivity of the common cathode 20 is generally poor to some degree. Particularly, in a top emission type organic light-emitting diode display panel, in order to take into account light transmittance as well, the common cathode is transparent and thin in thickness, thereby resulting in poor conductivity of the common cathode. As shown in FIG. 1A, in order to improve the conductivity of the common cathode 20, an auxiliary cathode (shown as a portion of the dashed line W0, which portion overlaps with the common cathode 20 in FIG. 1A) electrically connected to the common cathode 20 can be provided; in order to raise the conductive capacity of the common cathode 20, the auxiliary cathode can be directly connected to the first power line. For example, the auxiliary cathode can be disposed in a non-display region of the display panel (e.g., a peripheral region around a display region) and in a parallel connection with the common cathode; or, the auxiliary cathode can be disposed in the display region of the display panel and electrically connected to the common cathode at a plurality of positions, thereby being in a parallel connection with the common cathode, for example, the auxiliary cathode can be a mesh electrode and distributed in the spacing region between sub-pixels. For example, the common cathode is prepared by using indium tin oxide (ITO), while the auxiliary cathode is prepared by using a metal material (such as aluminum or an aluminum alloy). In the embodiments of the present disclosure, for convenience of description, in the case where the auxiliary cathode is present, the auxiliary cathode and the first power line are regarded as a whole, and are not intentionally distinguished or divided, which should not be taken as a limitation to the present disclosure.

When the organic light-emitting diode display panel 1 performs display using the plurality of sub-pixels 10 arranged in the array described above, the sub-pixels 10 are all powered by the first power terminal OVSS and the second power terminal OVDD, so there exists IR Drop (voltage drop due to resistance) phenomena relative to the first power terminal OVSS and the second power terminal OVDD. The IR drops generated as for different sub-pixels are different because different sub-pixels have different distances to the first power terminal OVSS and to the second power terminal OVDD. The IR drop phenomenon refers to such a phenomenon in which the voltage is divided due to presence of resistance of the wiring and therefore a voltage drop or rise from a power terminal to a voltage receiving terminal of an element is caused. This phenomenon is particularly noticeable in a large-sized display in which an organic light-emitting diode display panel 1 is applied. For example, because the second power line WD inevitably has a certain resistance, the second power voltage VDD1 received by a sub-pixel 10 closer to the second power terminal OVDD is greater than the second power voltage VDD2 received by a sub-pixel 10 farther away from the second power terminal OVDD in the organic light-emitting diode display panel 1, and the second power voltage VDD1 and the second power voltage VDD2 are both less than the original second power voltage VDD provided by the second power terminal OVDD. For example, because the first power line, the auxiliary cathode, the common cathode 20, etc., inevitably have a certain resistance, respectively, the first power voltage VSS1 received by a sub-pixel 10 closer to the first power terminal OVSS is less than the first power voltage VSS2 received by a sub-pixel 10 farther away from the first power terminal OVDD in the organic light-emitting diode display panel 1, and the first power voltage VSS1 and the first power voltage VSS2 are both greater than the original first power voltage VSS provided by the first power terminal OVSS.

As described above, when the OLED display panel 1 performs display, the driving current I generated by the pixel circuit (including the compensation circuit, such as the aforementioned compensation transistor) of the sub-pixel 10 and flowing through the light-emitting element is generally proportional to $(Vdata-VDD)^2$, where Vdata is the data voltage and VDD is the second power voltage. Due to the existence of the IR drop phenomenon, when a same gray-scale is to be displayed (that is, Vdata is the same) over the display panel, the display brightness of the sub-pixels 10 in different regions is different, so that the display panel exhibits a mura phenomenon, which disadvantageously affects the display effect of the display panel.

In order to solve the above problem, a compensation method is to determine the variation rule between the IR drop of the second power voltage VDD and the grayscale to be displayed by the sub-pixel 10 based on the resistance of the second power line WD, and then to transform the IR drop of the second power voltage VDD into a change value of the data voltage Vdata according to the variation rule, (for example, decreasing the original data voltage Vdata by the value of the IR drop of the second power voltage VDD), thereby performing grayscale compensation. The compensation process can be implemented, for example, by a timing controller of the display panel. After the timing controller receives the data signal of a display picture from a data source, the grayscale signal of a corresponding sub-pixel of the display picture is calculated to obtain a compensated grayscale signal according to the corresponding compensation algorithm, and the compensated grayscale signal is sent to a data driving circuit by the timing controller, and converted into a driving voltage that is supplied to the pixel driving circuit of the sub-pixel.

In research, the inventors of the present application observe that: the above compensation method ignores the IR drop of the first power voltage VSS. When the organic light-emitting diode display panel 1 displays a high gray-scale image, the total image current is large, for example, greater than a first threshold current Ith1, and at this time, the IR drop of the first power voltage VSS has an influence on the brightness of the sub-pixel 10 much less than the influence that the IR drop of the second power voltage VDD has on the brightness of the sub-pixel 10, that is, compared with the influence of the IR drop of the second power voltage VDD, the influence of the IR drop of the first power voltage VSS is negligible, thus a good display performance can be achieved by using the above compensation method to perform a grayscale compensation. However, when the organic light-emitting diode display panel 1 displays a medium-high grayscale image, the total image current is reduced to be, for example, not greater than the first threshold current Ith1 but greater than a second threshold current Ith2 (Ith2<Ith1), and at this time, the IR drop of the first power voltage VSS has an influence on the brightness of the sub-pixel 10 equivalent to the influence by the IR drop of the second power voltage VDD on the brightness of the sub-pixel 10, and the compensation effect of grayscale compensation by using the above compensation method is degraded. Moreover, when the organic light-emitting diode display panel 1 displays a medium or low grayscale images, the total image current is further reduced to be, for example, not greater than the second threshold current Ith2, and at this time, the IR drop of the first power voltage VSS has an influence on the brightness of the sub-pixel 10 greater than the influence by the IR drop of the second power voltage VDD on the brightness of the sub-pixel 10, and the compensation effect of the grayscale compensation by using the above compensation method is further deteriorated, and good display performance may not be achieved.

At least one embodiment of the present disclosure provides a driving method of a display panel; the display panel includes: a plurality of sub-pixels arranged in an array, the plurality of sub-pixels including a common cathode; a first power terminal, electrically connected to a first side of the common cathode, and configured to provide a first power voltage to the plurality of sub-pixels through the common cathode; a first wire and a first switch, a second end of the first wire being electrically connected to a second side of the common cathode, a first end of the first wire being electrically connected to the first power terminal, the first switch being set over the first wire and being configured to control whether the first wire is connected or disconnected, and the second side of the common cathode being opposite to the first side of the common cathode and away from the first power terminal; the driving method includes: obtaining a total image current of a display image of the plurality of sub-pixels arranged in the array; determining whether the total image current is greater than a first threshold current, if the total image current is greater than the first threshold current, controlling the first switch to disconnect the first wire, if the total image current is not greater than the first threshold current, controlling the first switch to connect the first wire, so that the second side of the common cathode is connected to the first power terminal through the first wire.

Some embodiments of the present disclosure also provide a display panel and a display device corresponding to the driving method.

The driving method of the display panel provided by the embodiments of the present disclosure can control the influence of the IR drop of the first power voltage VSS according to the magnitude of the total image current of the display image of the plurality of sub-pixels arranged in the array, thereby improving the display performance of the display panel; at the same time, the driving method has advantages of simple implementation, low cost, etc.

Embodiments of the present disclosure and examples thereof will be described in detail below with reference to the accompanying drawings.

Figure 2:
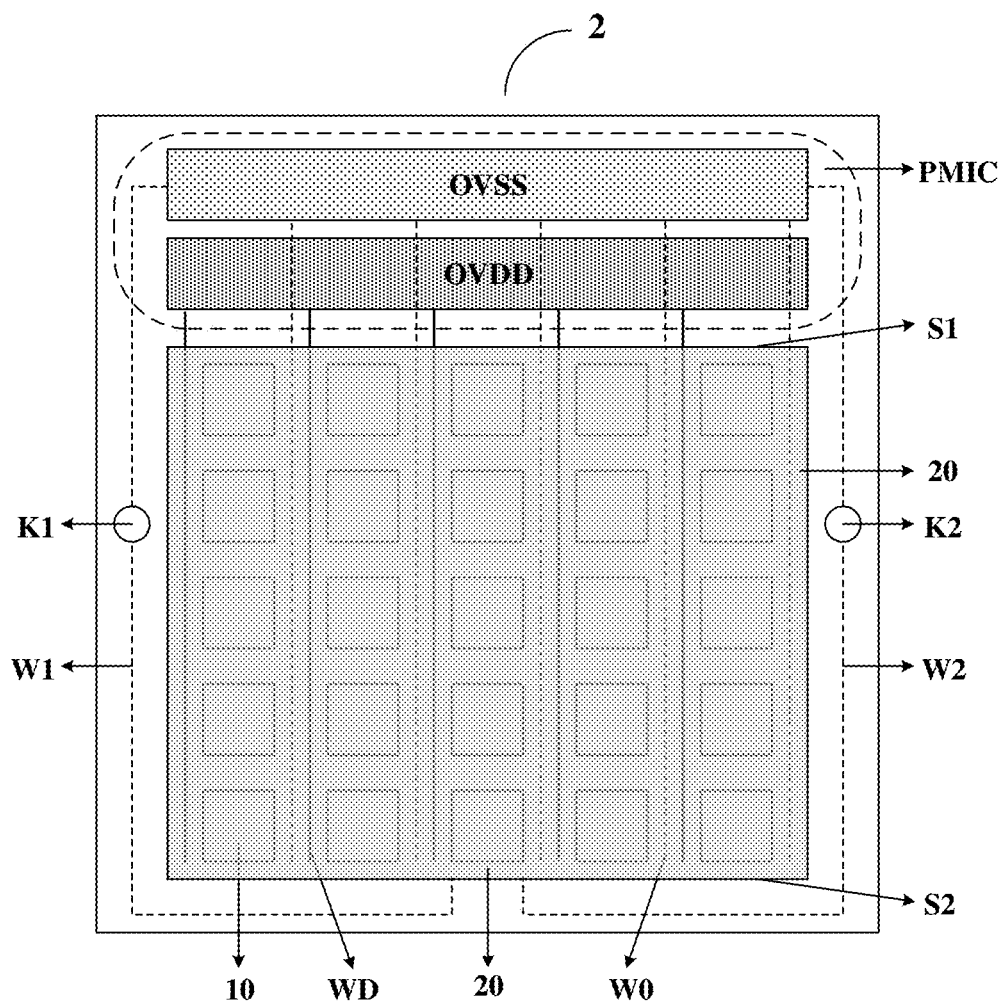
FIG. 2 is a schematic structural diagram of a display panel provided by some embodiments of the present disclosure.
Figure 3:
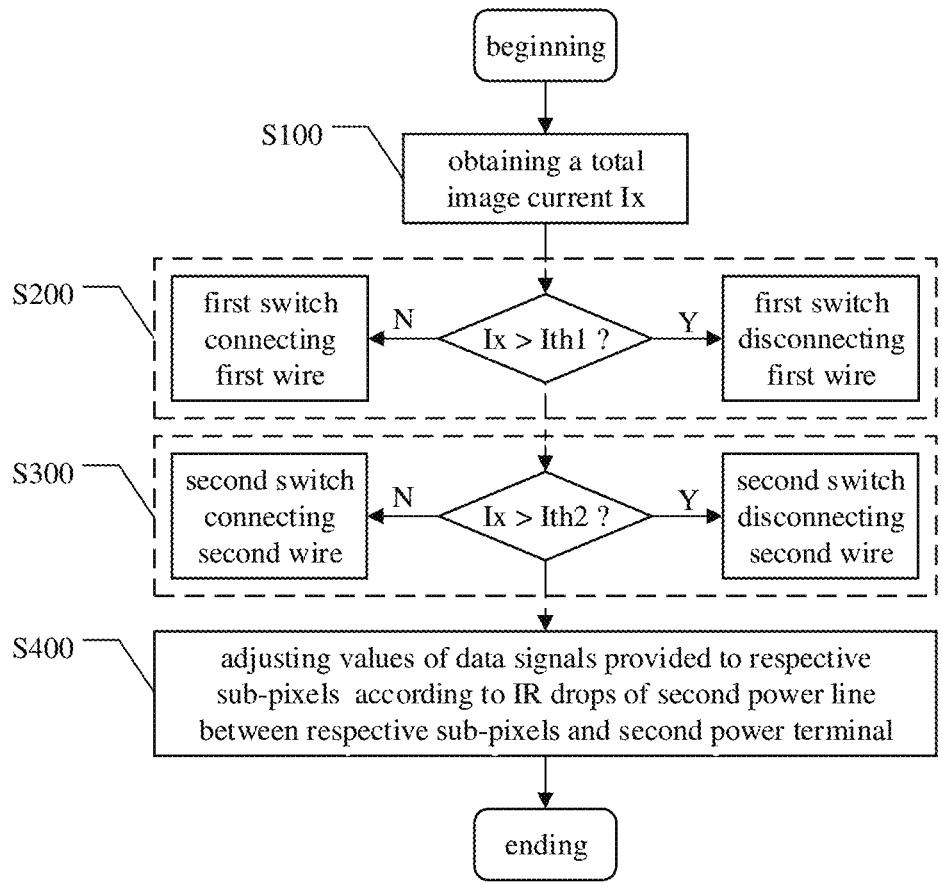
FIG. 3 is a flowchart of a driving method of a display panel provided by some embodiments of the present disclosure.

FIG. 2 is a schematic structural diagram of a display panel provided by some embodiments of the present disclosure. FIG. 3 is a flowchart of a driving method of a display panel provided by some embodiments of the present disclosure. The display panel provided by some embodiments of the present disclosure can be of various types according to the type of the light-emitting elements in the sub-pixels, for example, the display panel can be an organic light-emitting diode (OLED) display panel, a quantum dot light-emitting diode (QLED) display panel, an inorganic light-emitting diode display panel, etc.

Hereinafter, the driving method shown in FIG. 3 will be described in detail by taking that the display panel shown in FIG. 2 is an organic light emitting diode display panel 2 as an example. It should be noted that the driving method shown in FIG. 3 can be used to drive the display panel provided by any one embodiment of the present disclosure (which will be described in detail below upon introducing the display panel provided by the embodiments of the present disclosure), which is not limited to the organic light emitting diode display panel 2 shown in FIG. 2. In addition, as for the structures or components of the organic light emitting diode display panel 2 shown in FIG. 2 that are the same as those of the organic light emitting diode display panel 1 shown in FIG. 1A, specific details thereof may be referred to the foregoing description, which are only briefly described below.

For example, as shown in FIG. 2, the organic light emitting diode display panel 2 includes: a plurality of sub-pixels 10 arranged in an array, a first power terminal OVSS, a first wire W1 and a first switch K1; the plurality of sub-pixels 10 includes a common cathode 20, that is, the plurality of sub-pixels 10 share the same common cathode 20. The first power terminal OVSS is electrically connected to a first side S1 of the common cathode 20 and is configured to provide a first power voltage VSS for the plurality of sub-pixels 10 through the common cathode 20. For example, as shown in FIG. 2, the display panel 2 includes a power management integrated circuit (PMIC), which includes the first power terminal OVSS and a second power terminal OVDD to be described below. A second end of the first wire W1 is electrically connected to a second side S2 of the common cathode 20, a first end of the first wire W1 is electrically connected to the first power terminal OVSS, the first switch K1 is set over the first wire W1 and is configured to control whether the first wire W1 is connected or disconnected. When the first wire W1 is connected, the first power terminal OVSS is electrically connected to the second side S2 of the common cathode 20 and applies the first power voltage VSS to the second side S2 of the common cathode 20 directly through the first wire W1; when the first wire W1 is disconnected, for example, the first power terminal OVSS and the second side S2 of the common cathode 20 are electrically connected through the common electrode 20 itself (or further through an auxiliary cathode) and cannot be electrically connected through the first wire W1. The second side S2 of the common cathode 20 is opposite to the first side S1 of the common cathode 20 and is away from the first power terminal OVSS, and corresponding the first side S1 is close to the first power terminal OVSS.

It should be noted that the phrase "away from" and the like in the present disclosure is the same as "away from" in the foregoing description of the IR drop phenomenon, both referring to "away from" and the like in an electrical sense, rather than "away from" in a spatial position. Specifically, the IR drop of the first power voltage VSS at the first side S1 of the common cathode 20 close to the first power terminal OVSS is less than the IR drop of the first power voltage VSS at the second side S2 of the common cathode 20 away from the first power terminal OVSS.

In this case, for example, as shown in FIG. 3, the driving method includes step S100 to step S200.

Step S100: obtaining a total image current Ix of a display image of the plurality of sub-pixels 10 arranged in the array.

For example, in some examples, step S100 can include: predicting the total image current Ix according to grayscale signals of the display image (i.e., a current frame of display image that is displayed); or measuring a total image current of a previous frame of display image relative to the display image, and using the total image current of the previous frame of display image as the total image current Ix of the display image. For example, in the display process, the display panel displays a static image or dynamic images (e.g., video).

Figure 4:
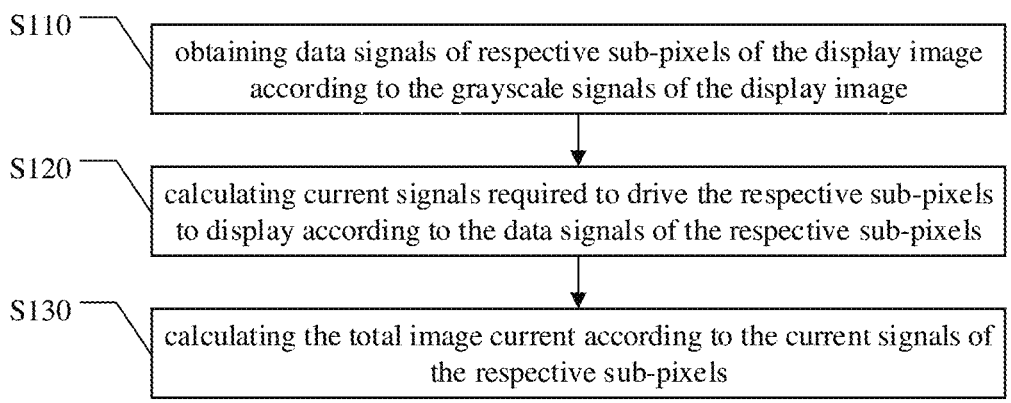
FIG. 4 is a flowchart of an implementation of step S100 in the driving method shown in FIG. 3A.

FIG. 4 is a flowchart of an implementation of step S100 in the driving method shown in FIG. 3A. For example, as shown in FIG. 4, the implementation is an implementation for predicting the total image current Ix according to the grayscale signals of the display image, and includes step S110 to step 130 as follows.

Step S110: obtaining data signals of respective sub-pixels of the display image according to the grayscale signals of the display image;

Step S120: calculating current signals required to drive the respective sub-pixels to display according to the data signals of the respective sub-pixels; and Step S130: calculating the total image current according to the current signals of the respective sub-pixels.

For example, in step S110, the data signals are the data voltages Vdata corresponding to the grayscale signals; in step S120, the current signals of the respective sub-pixels can be calculated according to the situation that the driving current I is proportional to $(Vdata-VDD)^2$, for example, actual values (the dimension of an actual value is a current dimension) of the current signals can be calculated, or relative values (the dimension of a relative value may be, for example, a square of a voltage dimension) of the current signals can be calculated; in step S130, the dimension of the total image current Ix is the same as the dimension of the current signals described above. It should be noted that, in the embodiments of the present disclosure, the dimensions of the first threshold current Ith1 and the second threshold current Ith2 are the same as the dimension of the total image current Ix. The range of a grayscale signal can be in various forms. For example, a grayscale signal can be expressed in 8 bits, and the value range thereof is from 0 to 255; or, a grayscale signal can be expressed in 12 bits, and the value range thereof is from 0 to 4095.

For example, when the implementation of step S100 is to measure the total image current of the previous frame of display image relative to the display image and to use the total image current of the previous frame of display image as the total image current Ix of the display image, the total image current of the previous frame of display image relative to the display image can be measured by a current sensing device or circuit, etc., connecting to the first power terminal OVSS or/and the second power terminal OVDD, and then be used as the total image current Ix of the display image, which is not limitative in the present disclosure. It should be noted that, when the display panel performs display, the brightness change between a former frame and a latter frame (two consecutive frames) of display images is generally small, especially when the display picture is stable and continuous, so the implementation has wide applicability. For example, by using the power management circuit, the magnitude of the average current outputted from the first power terminal or the second power terminal during the display process of the previous frame of display image can be measured and then be used as the total image current of the previous frame of display image, or the magnitude of the current outputted from the first power terminal or the second power terminal at the ending moment of the display process of the previous frame of display image can be measured and then be used as the total image current of the previous frame of display image.

It should be noted that the two implementations of step S100 described above are exemplary, and the specific implementation ways and the specific implementation details of step S100 are not limited by the embodiments of the present disclosure.

Step S200: determining whether the total image current Ix is greater than a first threshold current Ith1, if the total image current Ix is greater than the first threshold current Ith1, controlling the first switch K1 to disconnect the first wire W1, if the total image current Ix is not greater than the first threshold current Ith1, controlling the first switch K1 to connect the first wire W1, so that the second side S2 of the common cathode 20 is connected to the first power terminal OVSS through the first wire W1.

For example, when the total image current Ix is greater than the first threshold current Ith1, it can be determined that the display panel 2 is displaying a high grayscale image. At this time, the first switch K1 operates to make the first wire W1 disconnected, so that no extra power consumption is increased. For example, when the total image current Ix is not greater than the first threshold current Ith1, it can be determined that the display panel 2 is not displaying a high grayscale image, for example, thus a medium-high grayscale image or a medium-low grayscale image or a low grayscale image may be displayed. At this time, the first switch K1 operates to make the first wire W1 connected, so that a line resistance from the first power terminal OVSS to each of the sub-pixels 10 can be reduced, and the influence of the IR drop of the first power voltage VSS on the brightness of each sub-pixel 10 can be reduced, thereby improving the display performance.

In the embodiments of the present disclosure, high grayscales, medium grayscales and low grayscales respectively correspond to the cases where the magnitude of the current required for driving a sub-pixel to emit light are high, medium, or low, respectively. For example, in one example, the grayscale signal ranges from 0 to 255. For example, the sub-range 0-63 corresponds to low grayscales, the sub-range 64-191 corresponds to medium grayscales, and the sub-range 192-255 corresponds to high grayscales. Moreover, in the embodiments of the present disclosure, "high grayscale image" refers to that the average grayscale of the entire image is within the high grayscale range, and correspondingly, "medium grayscale image" refers to that the average grayscale of the entire image is within the medium grayscale range, "low grayscale image" refers to that the average grayscale of the entire image is within the low grayscale range. For example, the medium grayscale can be further divided into medium-low grayscales (sub-range 64-127) and medium-high grayscales (sub-range 128-191); correspondingly, "medium-low grayscale image" refers to that the average grayscale of the entire image is within the medium-low grayscale range, "medium-high grayscale image" refers to that the average grayscale of the entire image is within the middle-high grayscale range.

For example, as shown in FIG. 2, in at least one example, the display panel 2 further includes: a second wire W2 and a second switch K2. A second end of the second wire W2 is electrically connected to the second side S2 of the common cathode 20, a first end of the second wire W2 is electrically connected to the first power terminal OVSS, and the second switch K2 is set over the second wire W2 and is configured to control whether the second wire W2 is connected or disconnected. When the second wire W2 is connected, the first power terminal OVSS is electrically connected to the second side S2 of the common cathode 20 and applies the first power voltage VSS to the second side S2 of the common cathode 20 directly through the second wire W2; when the second wire W2 is disconnected, for example, the first power terminal OVSS and the second side S2 of the common cathode 20 are electrically connected through the common electrode 20 itself (or through the first wire W1) and cannot be electrically connected through the second wire W2. In this case, for example, as shown in FIG. 3, the driving method can further include step S300.

Step S300: determining whether the total image current Ix is greater than a second threshold current Ith2, if the total image current Ix is greater than the second threshold current Ith2, controlling the second switch K2 to disconnect the second wire W2, if the total image current Ix is not greater than the second threshold current Ith2, controlling the second switch K2 to connect the second wire W2, so that the second side S2 of the common cathode 20 is further connected to the first power terminal OVSS through the second wire W2; the second threshold current Ith2 is less than the first threshold current Ith1.

For example, in combination with step S200, when the total image current Ix is not greater than the first threshold current Ith1 but greater than the second threshold current Ith2, it can be determined that the display panel 2 is displaying a medium-high grayscale image. At this time, the first switch K1 operates to make the first wire W1 connected, and the second switch K2 operates to make the second wire W2 disconnected, so that the display performance is improved without further increasing an extra power consumption at the same time.

For example, when the total image current Ix is not greater than the second threshold current Ith2, it can be determined that the display panel 2 is displaying a medium-low grayscale image or a low grayscale image. At this time, the first switch K1 operates to make the first wire W1 connected, and also the second switch K2 operates to make the second wire W2 connected, so that the line resistance from the first power terminal OVSS to the each of the sub-pixels 10 can be further reduced, and the influence of the IR drop of the first power voltage VSS on the brightness of each sub-pixel 10 can be reduced further, thereby further improving the display performance.

For example, as shown in FIG. 2, the display panel 2 further includes a second power terminal OVDD and a second power line WD. The second power line WD is electrically connected to the plurality of sub-pixels 10, the second power terminal OVDD is electrically connected to the second power line WD, the second power terminal OVDD is configured to provide a second power voltage VDD (e.g., a high voltage) to the plurality of sub-pixels 10 through the second power line W2. In this case, for example, as shown in FIG. 3, the driving method can further include step S400.

Step S400: adjusting values of the data signals provided to the respective sub-pixels 10 according to IR drops of the second power line WD between the respective sub-pixels 10 and the second power terminal OVDD.

For example, step S400 can be implemented as the compensation method described above, and the implementation details thereof can be referred to the foregoing description with respect to the compensation method, which are not described herein again.

For example, in some examples, in step S400, adjustment values of the data signals of the respective sub-pixels are the same as the values of the IR drops of the second power voltage VDD, that is, the IR drops of the second power voltage VDD are equivalent to the change values of the data voltages Vdata.

It should be noted that, in the embodiments of the present disclosure, the flow of the driving method described above may include more or fewer steps, and some steps can be performed sequentially or in parallel. In the flow of the driving method described above, the order of conducting the respective steps is intended to achieve a compensation for IR drops (for example, the IR drops of the first power voltage VSS), but is not limited by the sequence numerals of the respective steps.

The driving method of the display panel provided by the embodiments of the present disclosure can dynamically adjust the line resistance between the first power terminal OVSS and each of the plurality of sub-pixels according to the magnitude of the total image current of the display image of the plurality of sub-pixels arranged in the array, so as to adjust the influence of the IR drop of the first power voltage VSS, thereby improving the display performance of the display panel; at the same time, the driving method has advantages of simple implementation, low cost, etc.

At least one embodiment of the present disclosure further provides a display panel, which can be driven by the driving method described above, thereby improving display performance and improving display quality.

Figure 5:
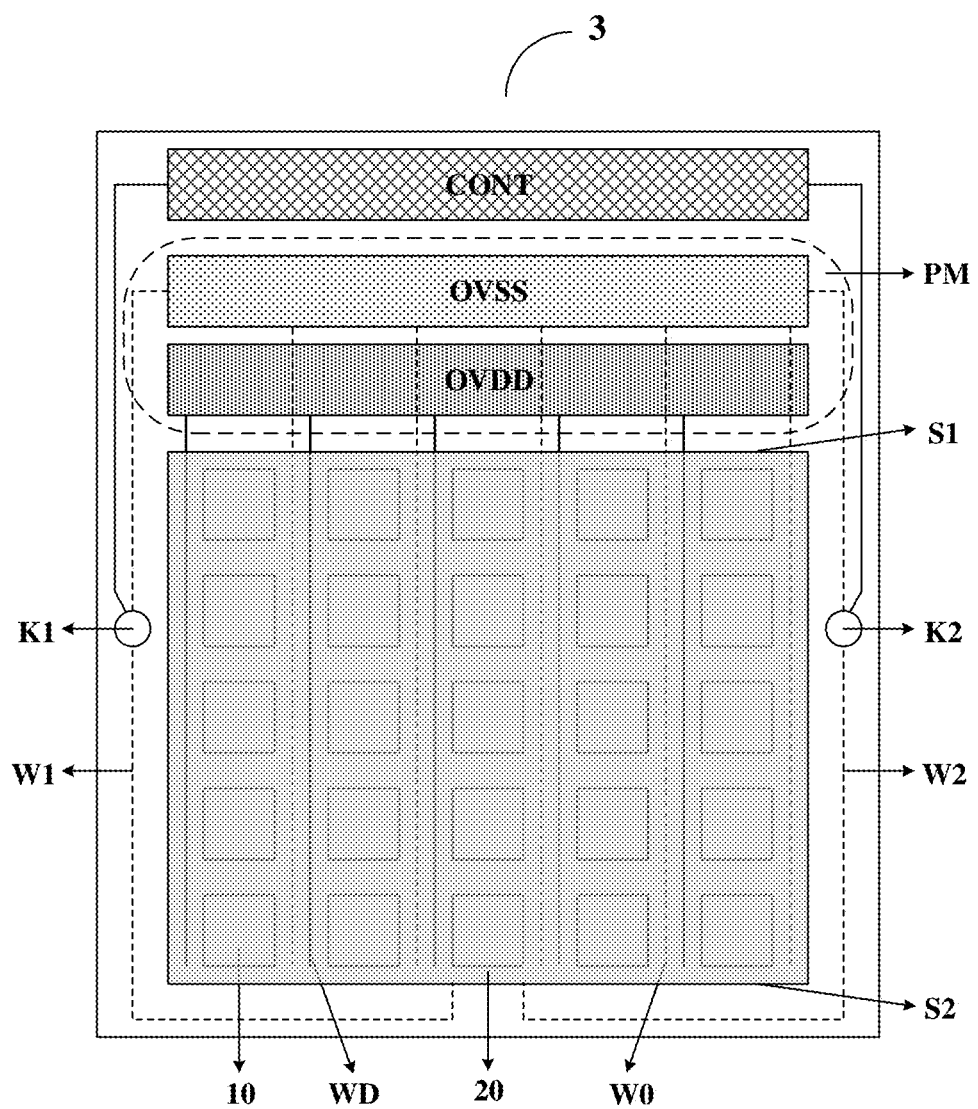
FIG. 5 is a schematic structural diagram of a display panel provided by some embodiments of the present disclosure.

FIG. 5 is a schematic structural diagram of a display panel provided by some embodiments of the present disclosure. As shown in FIG. 5, on the basis of the display panel shown in FIG. 2, the display panel 3 further includes a controller CONT. It should be noted that, for example, other structures or components of the display panel 3 shown in FIG. 5 are substantially the same as those of the display panel 2 shown in FIG. 2, and specific details may be referred to the foregoing description, which are only briefly described below.

For example, as shown in FIG. 5, the display panel 3 includes: a plurality of sub-pixels 10 arranged in an array, a first power terminal OVSS, a first wire W1 and a first switch K1; the plurality of sub-pixels 10 include a common cathode 20. The first power terminal OVSS is electrically connected to a first side S1 of the common cathode 20 and is configured to provide a first power voltage VSS for the plurality of sub-pixels 10 through the common cathode 20. A second end of the first wire W1 is electrically connected to a second side S2 of the common cathode 20, a first end of the first wire W1 is electrically connected to the first power terminal OVSS, the first switch K1 is set over the first wire W1 and is configured to control whether the first wire W1 is connected or disconnected. The second side S2 of the common cathode 20 is opposite to the first side S1 of the common cathode 20 and is away from the first power terminal OVSS.

For example, as shown in FIG. 5, the display panel 3 can further include a controller CONT. For example, the controller CONT can be implemented by hardware, software, firmware, or any combination thereof, for example, can be implemented as an integrated circuit (IC) chip. For example, the IC chip can be set on the display panel 3 in a bonding form of chip on flex (COF, also known as chip on film); for example, in one example, the controller can be implemented, for example, by a timing controller, that is, as a part of the timing controller. For example, the controller CONT is configured to obtain the total image current Ix of a display image of the plurality of sub-pixels 10 arranged in the array, and to determine whether the total image current Ix is greater than a first threshold current Ith1, if the total image current Ix is greater than the first threshold current Ith1, to control the first switch K1 to disconnect the first wire W1, and if the total image current Ix is not greater than the first threshold current Ith1, to control the first switch K1 to connect the first wire W1.

For example, the display panel 3 can improve the display performance by step S200 in the driving method described above, and specific details thereof may be referred to the foregoing description about step S200, which are not described herein again.

For example, in some examples, as to the controller CONT that is configured to obtain the total image current Ix of the display image of the plurality of sub-pixels arranged in the array, the controller CONT is further configured to predict the total image current Ix according to grayscale signals of the display image, or, configured to measure the total image current of a previous frame of display image and to use the total image current of the previous frame of display image as the total image current Ix of the display image. That is, the controller CONT can obtain the total image current Ix by using either of the two implementations of step S100 in the driving method described above.

For example, in some examples, as to the controller CONT that is configured to predict the total image current Ix according to the grayscale signals of the display image, the controller CONT is further configured to obtain data signals of respective sub-pixels of the display image according to the grayscale signals of the display image, to calculate current signals required to drive the respective sub-pixels to display according to the data signals of the respective sub-pixels, and to calculate the total image current Ix according to the current signals of the respective sub-pixels. That is, the controller CONT can use the steps S110 to S130 described above to predict the total image current Ix, and specific details thereof may be referred to the foregoing description about steps S110 to S130, which are not described herein again.

For example, the display panel 3 can further include: a second wire W2 and a second switch K2. A second end of the second wire W2 is electrically connected to the second side S2 of the common cathode 20, a first end of the second wire W2 is electrically connected to the first power terminal OVSS, and the second switch K2 is set over the second wire W2 and is configured to control whether the second wire W2 is connected or disconnected.

In this case, the controller CONT is further configured to determine whether the total image current Ix is greater than a second threshold current Ith2, if the total image current Ix is greater than the second threshold current Ith2, to control the second switch K2 to disconnect the second wire W2, and if the total image current Ix is not greater than the second threshold current Ith2, to control the second switch K2 to connect the second wire W2. The second threshold current Ith2 is less than the first threshold current Ith1. For example, the display panel 3 can improve the display performance by step S300 in the driving method described above, and specific details thereof may be referred to the foregoing description about step S300, which are not described herein again.

For example, as shown in FIG. 5, the display panel 3 can further include: a second power terminal OVDD and a second power line WD. The second power line WD is electrically connected to the plurality of sub-pixels 10, the second power terminal OVDD is electrically connected to the second power line WD, and the second power terminal OVDD is configured to provide a second power voltage VDD (a high voltage) to the plurality of sub-pixels 10 through the second power line W2. In this case, the controller CONT is further configured to adjust values of the data signals provided to the respective sub-pixels according to IR drops of the second power line WD between the respective sub-pixels and the second power terminal OVDD. For example, the display panel 3 can improve the display performance by step S400 (i.e., the compensation method described above) in the driving method described above, and specific details thereof may be referred to the foregoing description about step S400, which are not described herein again.

For example, in some examples, the controller CONT is further configured to make adjustment values of the data signals of the respective sub-pixels the same as values of the IR drops of the second power voltage VDD, that is, the IR drops of the second power voltage VDD are equivalent to the change values of the data voltages Vdata.

For example, in some examples, as shown in FIG. 5, the display panel 3 can further include a power management circuit PM. For example, the power management circuit PM can be implemented as a power management integrated circuit (PMIC) chip, and can be set on the display panel 3 in a bonding form of chip on flex (COF). For example, the power management circuit PM and the controller CONT can be set individually or integrated in one chip.

For example, the power management circuit PM includes the first power terminal OVSS and the second power terminal OVDD, and the first power voltage VSS provided by the first power terminal OVSS is different from the second power voltage VDD provided by the second power terminal OVDD. For example, the first power voltage VSS is a low voltage (e.g., a grounded voltage), and the second power voltage VDD is a high voltage that is higher than the first power voltage VSS. For example, when the display panel 3 performs display, the power management circuit PM can provide a stable DC voltage VSS at the first power terminal OVSS and a stable DC voltage VDD at the second power terminal OVDD.

It should be noted that, in the display panel 3 shown in FIG. 5, it is exemplary that the first wire W1 (together with the first switch K1) and the second wire W2 (together with the second switch K2) are disposed on two opposite sides of the display panel, respectively, and the arrangement positions of the first wire W1 and the second wire W2 are not limited in the present disclosure. Further, materials, structures and resistances of the first wire W1 and the second wire W2 can be selected or set according to actual needs, and are not limited in the present disclosure, either.

Figure 6:
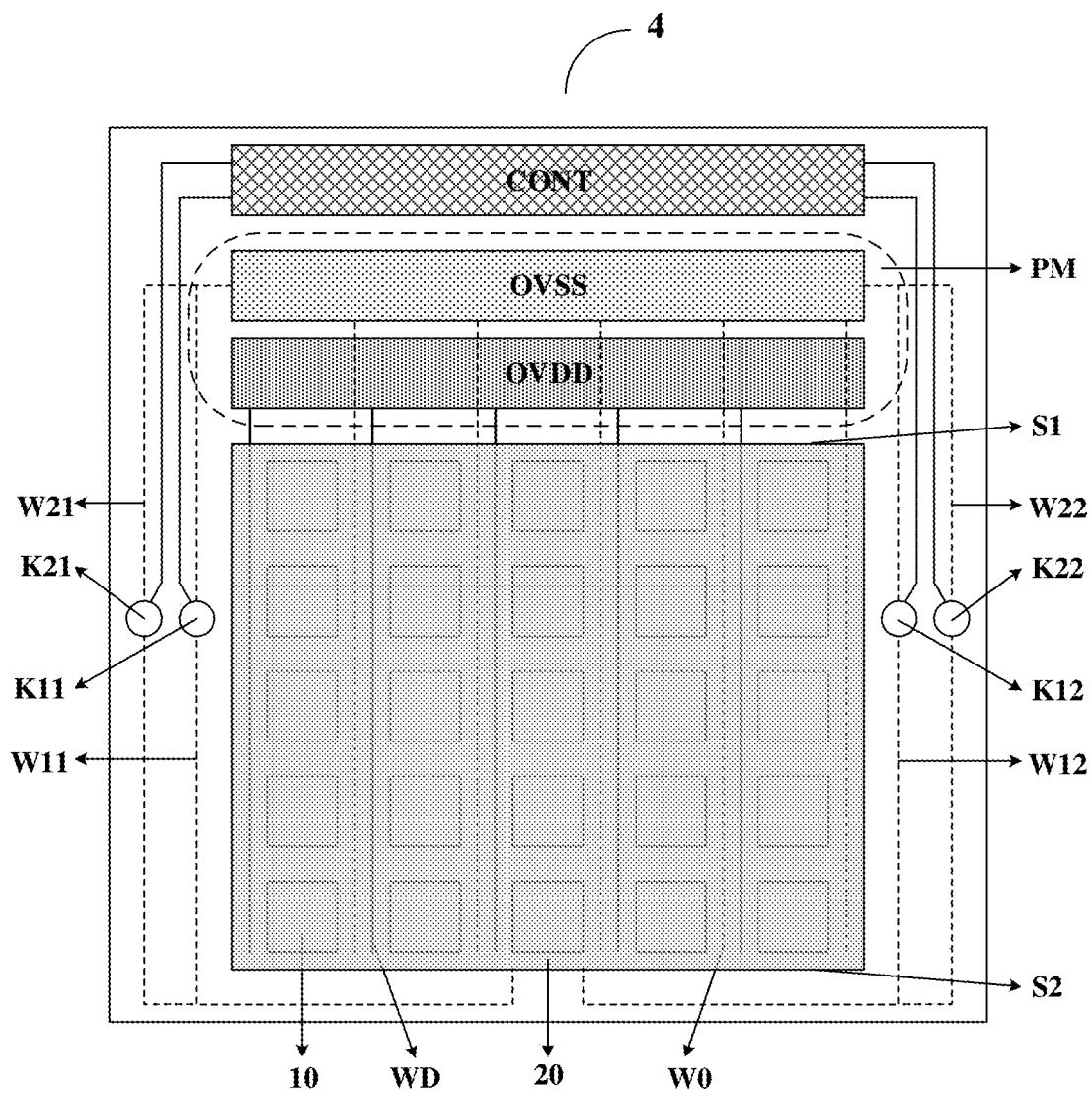
FIG. 6 is schematic structural diagram of another display panel provided by some embodiments of the present disclosure.

FIG. 6 is schematic structural diagram of another display panel provided by some embodiments of the present disclosure. The display panel 4 shown in FIG. 6 differs from the display panel 3 shown in FIG. 5 in that: in FIG. 6, the first wire includes a first sub-wire W11 and a second sub-wire W12, and the second wire includes a third sub-wire W21 and a fourth sub-wire W22; accordingly, the first switch includes a first sub-switch K11 and a second sub-switch K12, and the second switch includes a third sub-switch K21 and a fourth sub-switch K22. It should be noted that other structures or components of the display panel 4 shown in FIG. 6 are substantially the same as those of the display panel 3 shown in FIG. 5, and specific details may be referred to the foregoing description, which are not described herein again.

For example, as shown in FIG. 6, in the display panel 4, the first wire includes the first sub-wire W11 and the second sub-wire W12, and the first switch includes the first sub-switch K11 and the second sub-switch K12. For example, as shown in FIG. 6, the first sub-wire W11 and the second sub-wire W12 can be disposed on two opposite sides of the display panel 4, respectively. The first sub-switch K11 is set over the first sub-wire W11 and is configured to control whether the first sub-wire W11 is connected or disconnected, and the second sub-switch K12 is set over the second sub-wire W12 and is configured to control whether the second sub-wire W12 is connected or disconnected.

It should be noted that, when the display panel 4 is driven by the driving method described above, controlling the first switch to disconnect the first wire includes: controlling the first sub-switch K11 to disconnect the first sub-wire W11, and controlling the second sub-switch K12 to disconnect the second sub-wire W12; correspondingly, controlling the first switch to connect the first wire includes: controlling the first sub-switch K11 to connect the first sub-wire W11, and controlling the second sub-switch K12 to connect the second sub-wire W12. In this case, the line resistance from the first power terminal OVSS to each of the sub-pixels 10 can be better reduced by using two wires (i.e., the first sub-wire W11 and the second sub-wire W12) than by using one wire (i.e., only the first wire W1 shown in FIG. 5), and the influence of the IR drop of the first power voltage VSS on the brightness of each sub-pixel 10 can be better reduced, so that the display performance can be further improved.

It should be noted that, it is exemplary that the first sub-wire W11 and the second sub-wire W22 are disposed on two opposite sides of the display panel 4, respectively, which is not limitative in the present disclosure.

For example, as shown in FIG. 6, in the display panel 4, the second wire includes the third sub-wire W21 and the fourth sub-wire W22, and the second switch includes the third sub-switch K21 and the fourth sub-switch K22. For example, as shown in FIG. 6, the third sub-wire W21 and the fourth sub-wire W22 can be disposed on two opposite sides of the display panel 4, respectively. The third sub-switch K21 is set over the third sub-wire W21 and is configured to control whether the third sub-wire W21 is connected or disconnected, the fourth sub-switch K22 is set over the fourth sub-wire W22 and is configured to control whether the fourth sub-wire W22 is connected or disconnected.

It should be noted that, when the display panel 4 is driven by the driving method described above, controlling the second switch to disconnect the second wire includes: controlling the third sub-switch K21 to disconnect the third sub-wire W21, and controlling the fourth sub-switch K22 to disconnect the fourth sub-wire W22; correspondingly, controlling the second switch to connect the second wire includes: controlling the third sub-switch K21 to connect the third sub-wire W21, and controlling the fourth sub-switch K22 to connect the fourth sub-wire W22. In this case, the line resistance from the first power terminal OVSS to each of the sub-pixels 10 can be further reduced by using two wires (i.e., the third sub-wire W21 and the fourth sub-wire W22) than by using one wire (i.e., the second wire W2 shown in FIG. 5), and the influence of the IR drop of the first power voltage VSS on the brightness of each sub-pixel 10 can be further reduced, so that the display performance can be further improved.

It should be noted that, it is exemplary that the third sub-wire W21 and the fourth sub-wire W22 are disposed on two opposite sides of the display panel 4, respectively, which is not limitative to this case in the present disclosure.

It should be noted that, in the embodiment shown in FIG. 6, the number of sub-wires included in the first wire, the number of sub-wires included in the second wire and the arrangement manner of the sub-wires are exemplary, and are not limited to the above cases in the present disclosure.

It should also be noted that, in the embodiments of the present disclosure, a switch (e.g., the first switch K1, the second switch K2) may be any component or element (e.g., a transistor, etc.) capable of functioning to switch on or off, and is not limited to the described cases in the present disclosure. In addition, the switches in the embodiments of the present disclosure can also be integrated with the controller, and this case is not limitative in the present disclosure, either.

For example, the display panel provided by some embodiments of the present disclosure, as shown in FIG. 2, FIG. 5 and FIG. 6, can further include an auxiliary cathode or more (shown as a portion of the dashed line W0 overlapping with the common cathode 20 in FIG. 2, FIG. 5 and FIG. 6). The auxiliary cathode is disposed in a non-display region (e.g., a peripheral region) or a display region of the display panel, is electrically connected to the first power terminal OVSS, and is at least electrically connected to the second side S2 of the common cathode 20. Specific arrangement details of the auxiliary cathode can be referred to the foregoing description about the auxiliary cathode in the embodiment shown in FIG. 1A, and are not repeatedly described by the present disclosure herein.

It should be noted that, in the present disclosure, the way of being electrically connected to the first side or the second side of the common cathode, can be include the way of being electrically connected to an edge of the first side or the second side of the common cathode, or can also include the way of being electrically connected to a region close to the edge of the first side or the second side of the common cathode, and the specific ways are not limitative for the embodiments of the present disclosure.

Technical effects of the display panel provided by the embodiments of the present disclosure can be referred to the related description of the driving method in the aforementioned embodiments, and are not described here again.

At least one embodiment of the present disclosure further provides a display device, which includes the display panel provided by the aforementioned embodiments. For example, the display device can further include a gate driving circuit and a data driving circuit, etc.

For example, the gate driving circuit can provide scan signals to the plurality of sub-pixels of the display panel through gate lines. For example, the gate driving circuit can be implemented as a bonded integrated circuit driving chip, or the gate driving circuit can be directly integrated on the display panel to form a GOA (Gate driver On Array).

For example, the data driving circuit can provide data signals to the plurality of sub-pixels of the display panel through data lines. For example, the data driving circuit can be implemented as a bonded integrated circuit driving chip.

It should be noted that, the display device in the present embodiment can be any product or component having a display function, such as a display, a television, an electronic paper display device, a mobile phone, a tablet computer, a notebook computer, a digital photo frame, a navigator, etc. It should be noted that, the display device can also include other conventional components or structures. For example, in order to implement necessary functions of the display device, those skilled in the art can set other conventional components or structures according to specific application scenarios, which are not limited by the embodiments of the present disclosure.

Technical effects of the display device provided by the embodiments of the present disclosure can be referred to the related description of the driving method in the aforementioned embodiments, and are not described here again.

For the disclosure, the following statements should be noted:

(1) The accompanying drawings related to the embodiment(s) of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale.

(3) In case of no conflict, features in one embodiment or in different embodiments can be combined.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A driving method of a display panel, wherein the display panel comprises:
   a plurality of sub-pixels arranged in an array, the plurality of sub-pixels comprising a common cathode;
   a first power terminal, electrically connected to a first side of the common cathode, and configured to provide a first power voltage to the plurality of sub-pixels through the common cathode;
   a first wire and a first switch, a second end of the first wire being electrically connected to a second side of the common cathode, a first end of the first wire being electrically connected to the first power terminal, the first switch being set over the first wire and being configured to control whether the first wire is connected or disconnected, and the second side of the common cathode being opposite to the first side of the common cathode and away from the first power terminal; and
   the driving method comprises:
   obtaining a total image current of a display image of the plurality of sub-pixels arranged in the array; and
   determining whether the total image current is greater than a first threshold current,
   if the total image current is greater than the first threshold current, controlling the first switch to disconnect the first wire, and
   if the total image current is not greater than the first threshold current, controlling the first switch to connect the first wire, so that the second side of the common cathode is connected to the first power terminal through the first wire.

2. The driving method according to claim 1, wherein the display panel further comprises:
   a second wire and a second switch, a second end of the second wire being electrically connected to the second side of the common cathode, a first end of the second wire being electrically connected to the first power terminal, and the second switch being set over the second wire and being configured to control whether the second wire is connected or disconnected; and
   the driving method further comprises:
   determining whether the total image current is greater than a second threshold current,
   if the total image current is greater than the second threshold current, controlling the second switch to disconnect the first wire, and
   if the total image current is not greater than the second threshold current, controlling the second switch to connect the first wire, so that the second side of the common cathode is connected to the first power terminal through the second wire,
   wherein the second threshold current is less than the first threshold current.

3. The driving method according to claim 1, wherein obtaining the total image current of the display image of the plurality of sub-pixels arranged in the array comprises:
   predicting the total image current according to grayscale signals of the display image; or
   measuring a total image current of a previous frame of the display image, and using the total image current of the previous frame of the display image as the total image current of the display image.

4. The driving method according to claim 3, wherein predicting the total image current according to the grayscale signals of the display image comprises:
   obtaining data signals of respective sub-pixels of the display image according to the grayscale signals of the display image;
   calculating current signals required to drive the respective sub-pixels to display according to the data signals of the respective sub-pixels; and
   calculating the total image current according to the current signals of the respective sub-pixels.

5. The driving method according to claim 1, wherein the display panel further comprises:
   a second power terminal and a second power line, the second power line being electrically connected to the plurality of sub-pixels, the second power terminal being electrically connected to the second power line, and the second power terminal being configured to provide a second power voltage to the plurality of sub-pixels through the second power line; and
   the driving method further comprises:
   adjusting values of the data signals provided to the respective sub-pixels according to IR drops of the second power line between the respective sub-pixels and the second power terminal.

6. The driving method according to claim 5, wherein adjustment values of the data signals of the respective sub-pixels are the same as values of the IR drops.

7. A display panel, comprising:
   a plurality of sub-pixels arranged in an array, the plurality of sub-pixels comprising a common cathode;
   a first power terminal, electrically connected to a first side of the common cathode, and configured to provide a first power voltage to the plurality of sub-pixels through the common cathode;
   a first wire and a first switch, a second end of the first wire being electrically connected to a second side of the common cathode, a first end of the first wire being electrically connected to the first power terminal, the first switch being set over the first wire and being configured to control whether the first wire is connected or disconnected, and the second side of the common cathode being opposite to the first side of the common cathode and away from the first power terminal.

8. The display panel according to claim 7, further comprising:
   a controller, configured to obtain a total image current of a display image of the plurality of sub-pixels arranged in the array, to determine whether the total image current is greater than a first threshold current, if the total image current is greater than the first threshold current, to control the first switch to disconnect the first wire, and if the total image current is not greater than the first threshold current, to control the first switch to connect the first wire.

9. The display panel according to claim 8, further comprising: a second wire and a second switch, a second end of the second wire being electrically connected to the second side of the common cathode, a first end of the second wire being electrically connected to the first power terminal, and the second switch being set over the second wire and being configured to control whether the second wire is connected or disconnected.

10. The display panel according to claim 9, wherein the controller is further configured to determine whether the total image current is greater than a second threshold current, if the total image current is greater than the second threshold current, to control the second switch to disconnect the second wire, and if the total image current is not greater than the second threshold current, to control the second switch to connect the second wire, wherein the second threshold current is less than the first threshold current.

11. The display panel according to claim 8, wherein in order to obtain the total image current of the display image of the plurality of sub-pixels arranged in the array, the controller is further configured to predict the total image current according to grayscale signals of the display image, or, configured to measure a total image current of a previous frame of display image and to use the total image current of the previous frame of display image as the total image current of the display image.

12. The display panel according to claim 11, wherein in order to predict the total image current according to the grayscale signals of the display image, the controller is further configured to obtain data signals of respective sub-pixels of the display image according to the grayscale signals of the display image, to calculate current signals required to drive the respective sub-pixels to display according to the data signals of the respective sub-pixels, and to calculate the total image current according to the current signals of the respective sub-pixels.

13. The display panel according to claim 8, further comprising:

a second power terminal and a second power line, the second power line being electrically connected to the plurality of sub-pixels, the second power terminal being electrically connected to the second power line, and the second power terminal being configured to provide a second power voltage to the plurality of sub-pixels through the second power line.

14. The display panel according to claim 13, wherein the controller is further configured to adjust values of the data signals provided to the respective sub-pixels according to IR drops of the second power line between the respective sub-pixels and the second power terminal.

15. The display panel according to claim 14, wherein the controller is further configured to make adjustment values of the data signals of the respective sub-pixels the same as values of the IR drops.

16. The display panel according to claim 13, further comprising: a power management circuit, wherein the power management circuit comprises the first power terminal and the second power terminal, and the first power voltage is different from the second power voltage.

17. The display panel according to claim 7, wherein the first wire comprises a first sub-wire and a second sub-wire, the first switch comprises a first sub-switch and a second sub-switch;

the first sub-wire and the second sub-wire are disposed on opposite sides of the display panel, respectively, the first sub-switch is set over the first sub-wire and is configured to control whether the first sub-wire is connected or disconnected, and the second sub-switch is set over the second sub-wire and is configured to control whether the second sub-wire is connected or disconnected.

18. The display panel according to claim 9, wherein the second wire comprises a third sub-wire and a fourth sub-wire, the second switch comprises a third sub-switch and a fourth sub-switch;

the third sub-wire and the fourth sub-wire are disposed on opposite sides of the display panel, respectively, the third sub-switch is set over the third sub-wire and is configured to control whether the third sub-wire is connected or disconnected, and the fourth sub-switch is set over the fourth sub-wire and is configured to control whether the fourth sub-wire is connected or disconnected.

19. The display panel according to claim 7, further comprising: an auxiliary cathode, wherein the auxiliary cathode is electrically connected to the first power terminal and at least electrically connected to the second side of the common cathode.

20. A display device, comprising a display panel, wherein the display panel comprises:

a plurality of sub-pixels arranged in an array, the plurality of sub-pixels comprising a common cathode;

a first power terminal, electrically connected to a first side of the common cathode, and configured to provide a first power voltage to the plurality of sub-pixels through the common cathode;

a first wire and a first switch, a second end of the first wire being electrically connected to a second side of the common cathode, a first end of the first wire being electrically connected to the first power terminal, the first switch being set over the first wire and being configured to control whether the first wire is connected or disconnected, and the second side of the common cathode being opposite to the first side of the common cathode and away from the first power terminal.

\* \* \* \* \*